United States Patent [19]

Sadamasa et al.

[11] 4,322,735
[45] Mar. 30, 1982

[54] DISPLAY DEVICE

[75] Inventors: Tetsuo Sadamasa, Tokyo; Osamu Ichikawa, Inagi, both of Japan

[73] Assignee: Tokyo Shibaura Denki Kabushiki Kaisha, Japan

[21] Appl. No.: 146,790

[22] Filed: May 5, 1980

[30] Foreign Application Priority Data

May 11, 1979 [JP] Japan .................................. 54-56950

[51] Int. Cl.³ ........................................... H01L 33/00
[52] U.S. Cl. ....................................... 357/17; 357/75; 357/80
[58] Field of Search ...................... 357/30, 75, 80, 17

[56] References Cited

U.S. PATENT DOCUMENTS

| 3,932,927 | 1/1976 | Grenon | 357/17 |
| 3,936,694 | 2/1976 | Akiyama | 367/17 |
| 4,007,396 | 2/1977 | Wisby | 357/17 |
| 4,011,575 | 3/1977 | Groves | 357/80 |
| 4,213,141 | 7/1980 | Colussi | 357/80 |
| 4,241,281 | 12/1980 | Morimoto | 357/17 |

OTHER PUBLICATIONS

Niina et al., Conf. Record of 1978 Biennial Display Research Conf., Oct. 24–26, 1978, pp. 18–19.
Harris, Conf. Record of 1978 Biennial Display Res. Conf., Oct. 24–26, 1978, pp. 20–21.

Primary Examiner—Martin H. Edlow
Attorney, Agent, or Firm—Finnegan, Henderson, Farabow, Garrett & Dunner

[57] ABSTRACT

A display device has a relatively large insulation substrate on which a metal layer is formed. On the metal layer on the insulation substrate, there are at least one pair of ceramic unit substrates which are disposed in close vicinity to each other, respectively having thereon metal layers bearing light emitting diodes. The metal layer on the insulation substrate is connected with the metal layers on the unit substrates at its end portions by means of, e.g., flexible lead frames.

8 Claims, 5 Drawing Figures

DISPLAY DEVICE

BACKGROUND OF THE INVENTION

I. Field of the Invention

This invention relates to a display device using light emitting diodes (LED's), and, more particularly, to a large-sized display device including relatively small substances connected with one another.

II. Description of the Prior Art

Generally, in a display device for displaying desired patterns, such as letters, numerals, chinese characters, special symbols, illustrations, graphic patterns, etc., a plurality of light sources formed of LED's are closely disposed on a common substrate. A desired pattern is displayed by selectively supplying electric signals to the individual LED's. Since the electric signals are transmitted intermittently as short pulses, the individual LED's are driven only instantaneously. By repeatedly transmitting the electric signals at high speed, however, the pattern may be caused to look stationary with the aid of the afterimage effect of the human eye.

Recently, display devices of the aforesaid type have come to show a tendency toward enlargement in size as the amount of information to be displayed has increased with the development of measuring instruments and electronic computers. There are proposed two measures for increasing the size of display devices: mounting of a plurality of LED's on a large-sized substrate and a method in which a plurality of relatively small substrtates each having LED's mounted thereon are electrically connected with one another. The former measure has not, however, been put to practical use because of its requiring complicated driving systems as well as its deteriorating yield of production.

FIG. 1 shows a typical example of the latter measure. In this display device, as shown in FIG. 1, two substrates, for example, are connected by means of wires. More specifically, horizontally extending parallel wiring layers 12 are formed at regular intervals on a first substrate 11. Each wiring layer 12 has relatively wide regions 12a on which LED's 13 are fixed with their cathode side downward. LED's fixed on each two adjacent wiring layers are electrically connected by stitch bonding on the anode side with use of wires 14.

A second substrate 15 has wiring layers 16 which are the same as the wiring layers 12 of the first substrate 11 and LED's 17 are connected with one another by means of wires 18. The second substrate 15 is disposed in close vicinity to the first substrate 11 so as to be symmetrical with respect to an axis A—A at right angles to the wiring layers 12 and 16. Bonding pads 12b and 16b are provided respectively at the facing ends of the respective wiring layers of the substrates 11 and 15, and the wiring layers 12 and 16 are connected at these bonding pads by means of gold wires 19.

In such display device, the bonding pads 12b and 16b require a diameter of 0.2 mm or more for wire bonding. In view of the performance of currently available bonding machines, moreover, a certain measure of space (usually 0.5 mm) need be left between each bonding pad 12b or 16b and the LED 13 or 17 nearest thereto. In consideration of the bonding accuracy of the adjoining portions of the substrates, furthermore, a space of 1.5 mm or more is required between the LED's 13 and 17. With such wide space, however, the portion of a display pattern corresponding to such space will be unclear to the human eye.

Further, this second measure cannot be applied to the connection between substrates with double-layer matrix wiring structure. Conventionally, as shown in FIG. 2, one such substrate with double-layer wiring structure includes row wiring layers 22 formed on a ceramic substrate 21, an insulation layer 23 with openings formed on the row wiring layers, and a column wiring layer 24 on the insulation layer 23. LED's 25 are fixed on exposed portions of the row wiring layers, each LED being connected at its anode side with the column wiring layers 24 by means of wires 26. In the double-layer wiring substrate of such construction, as may be seen from FIG. 2, the row wiring layers 22 is embedded in the insulation layer 23 at the end portion. Accordingly, it is impossible to bond one such substrate to another by using wires in the manner shown in FIG. 1.

SUMMARY OF THE INVENTION

Accordingly, an object of this invention is to provide a display device without the above-mentioned drawbacks of the prior art devices.

Another object of the invention is to provide a coupled-substrate display device with a reduced light source arrangement pitch.

Still another object of the invention is to provide a coupled-substrate display device producing distinct display patterns.

According to this invention, there is provided a display device comprising an insulation substrate, first conductive means formed on the insulation substrate and including at least one elongated metal layer, an insulation means formed on the first conductive means and including at least one pair of insulation layers facedly disposed near but spaced from each other along the longitudinal direction of the metal layer, second conductive means formed on the insulation means and including at least one pair of elongated metal layers formed respectively on the insulation layers in a position corresponding to the metal layer of the first conductive means, a light source formed on the second conductive means and including at least one light emitting diode, and connection means including at least one pair of connection members connecting the first and second conductive means at sides opposite to the facing sides of the pair of insulation layers.

DETAILED DESCRIPTION OF THE PREFERRED EMBODIMENTS

Figure 1:
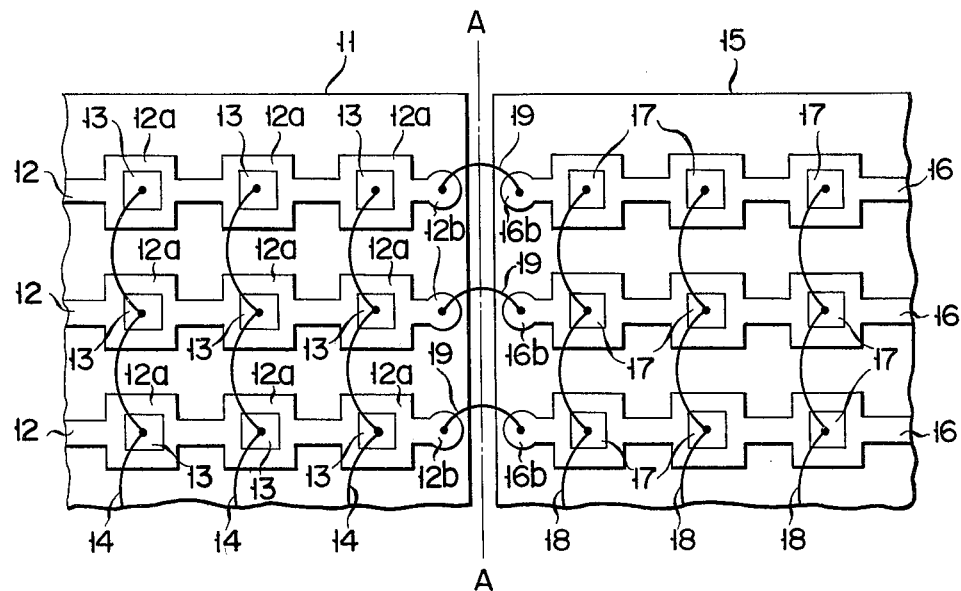
FIG. 1 is a partial plan view of a prior art coupled-substrate display device.
Figure 2:
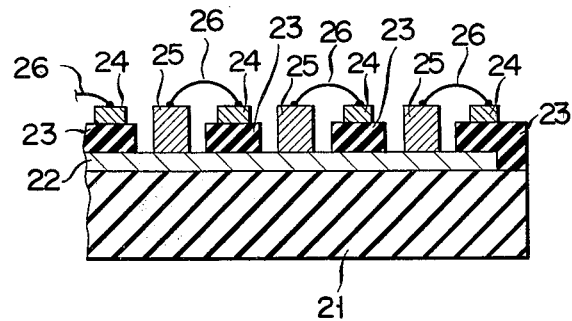
FIG. 2 is a partial sectional view of a prior art double-layer wiring display device.

Referring now to the drawings of FIGS. 3 to 6, this invention will be described in detail.

Figure 3:
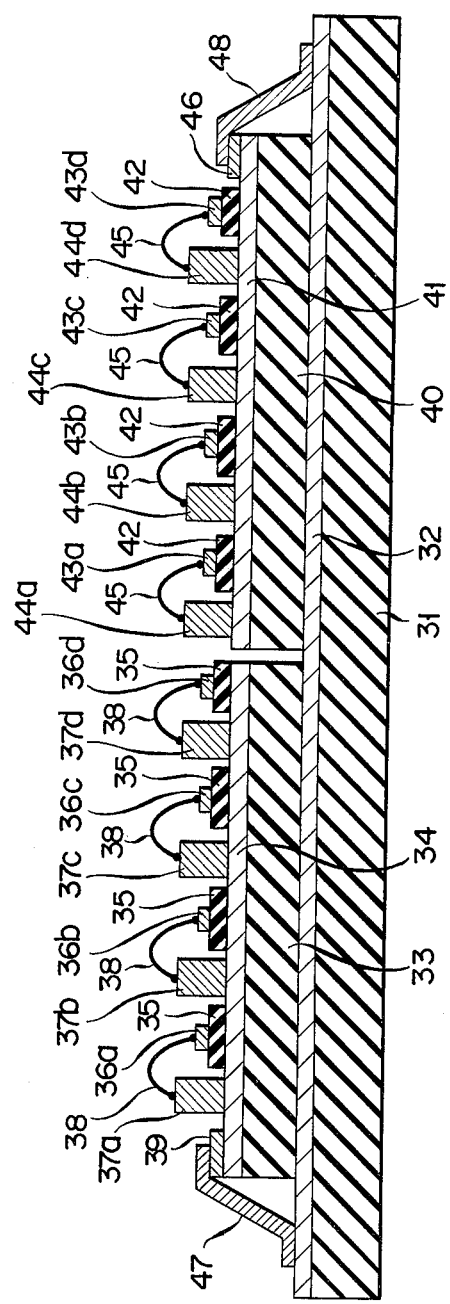
FIG. 3 is a sectional view of a display device according to an embodiment of this invention.

A display device shown in FIG. 3 includes two unit substrates 33 and 40 coupled with each other. On a single large-sized insulation substrate such as a glass-epoxy substrate 31, as shown in FIG. 3, there are a plurality of elongated metal layers 32 formed of, e.g. solder, extending horizontally in parallel with one another substantially at regular intervals. On the metal layers 32, the ceramic substrates 33 and 40, e.g., alumina substrates, serving as insulation layers with light emitting elements are facedly disposed near but spaced from each other along the longitudinal direction of the metal layers 32.

On the one alumina substrate 33, there are a plurality of elongated metal layers (wiring layers) 34 which, formed by printing and baking, e.g., hold paste at a temperature of 900° C. to 1,100° C., extend horizontally in parallel with one another substantially at regular intervals. The metal layers 34 lie in positions corresponding to the metal layers 32 on the insulation substrate 31. Further, an insulation layer 35 is formed by printing and baking ceramic paste over the whole surface of each metal layer 34 except an end portion thereof on the opposite side to a portion where the substrate 33 adjoins the substrate 40 and predetermined portions on the metal layer 34. On the insulation layer 35, there are elongated metal layers (wiring layers) 36a, 36b, 36c and 36d formed of, e.g. gold, extending at right angles to the longitudinal direction of the metal layers 34. Thus, the lower metal layers 34 and the upper metal layers 36a, 36b, 36c and 36d constitute a double-layer matrix wiring structure.

Cathodes of light emitting diodes (LED's) 37a, 37b and 37c constituting a light source are fixed to the predetermined of exposed portions of the metal layers 34 on the alumina substrate 33 by using low melting metal paste such as silver paste. These LED's may be manufactured by, for example, forming a p-type single crystal of gallium phosphide on an n-type single crystal substrate of gallium phosphide by liquid-phase growth method and dicing the p-type single crystal into pellets. A cathode and an anode are formed on n- and p-type layers, respectively. Each LED is caused to emit light by applying a positive voltage between the anode and cathode.

The anodes of the LED's 37a, 37b and 37c are bonding-connected with their corresponding or adjacent metal layers 36a, 36b, 36c and 36d along the longitudinal direction of the metal layers 34 by means of gold wires 38 with a diameter of, e.g., 30 $\mu$m.

The alumina substrate 40, like the alumina substrate 33, is provided with elongated metal layers 41 formed thereon, an insulation layer 42 formed on the metal layers 41, elongated metal layers 43a, 43b, 43c and 43d formed on the insulation layer 42, and LED's 44a, 44b and 44c formed on exposed portions of the metal layers 41 and having their anodes connected respectively with the metal layers 43a, 43b, 43c and 43d by means of gold wires 45.

The insulation layer 35 exists at the end portion of the alumina substrate 33 where it adjoins the substrate 40, while the LED 44a is disposed at the adjoining end of the substrate 40. Further, simultaneously with the formation of these metal layers, input-output terminals 39 and 46 of 100-$\mu$m thickness are formed respectively on the metal layers 34 and 41 at end portions opposite to the facing sides of the substrates 33 and 40. The metal layers 34 substantially align with their corresponding metal layers 41. Moreover, as may be seen from the drawing, the metal layers 32 on the insulation substrate 31 are exposed at both ends.

One of the features of this invention resides in that the metal layers 34 and 41, in the aforementioned structure, are connected with exposed portions of their corresponding metal layers 32 at the input-output terminals 39 and 46 by means of flexible lead frames 47 and 48 of, e.g., 200-$\mu$m width and 20-$\mu$m thickness. Thus, the metal layers 34 and 41 on the substrates 33 and 40 are made electrically common by means of the frames 47 and 48 and the metal layers 32 on the insulation substrate 31.

In the above-mentioned display device of this invention, the substrates 33 and 40 are not bonded at the facing ends thereof by means of wires, so that the problems of the prior art device shown in FIG. 1 may be eliminated. Actually, the arrangement pitch of the LED's could be reduced to approximately 0.8 mm, ensuring improved resolution or outward appearance of display patterns. Further, the junction of the substrates 31 and 40 proved hardly noticeable. Moreover, according to the aforesaid display device of the invention, a plurality of substrates of multilayer wiring structure can be connected with one another, as is evident from the foregoing description. Also, yield may be improved since the substrates are not connected by means of the wires, unlike the case of the prior art device.

Although only the two substrates 31 and 40 are used in the above-mentioned embodiment, a plurality of such pairs of substrates may be disposed at right angles to the longitudinal direction of the metal layers 32, thereby providing a further enlarged device.

Figure 4:
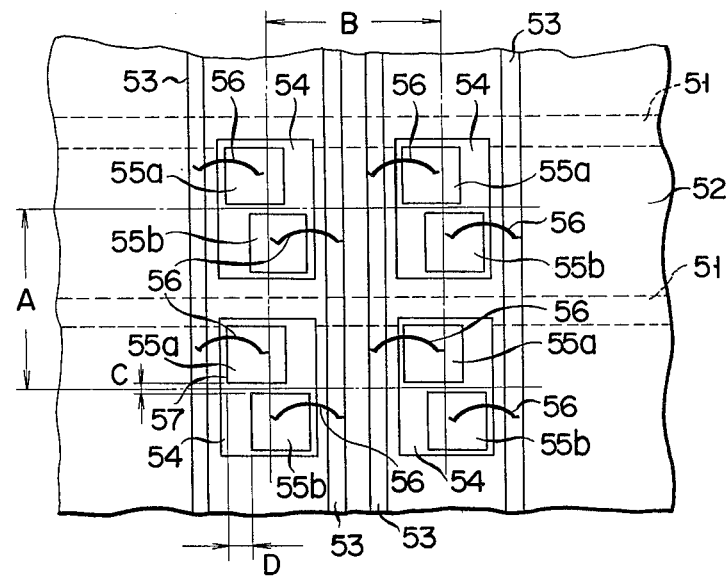
FIG. 4 is a partial plan view of a display device according to another embodiment of the invention.

Moreover, the arrangement of the LED's on the substrates 31 and 40 is not limited to the aforesaid embodiment, and a multicolor display device may be obtained by closely arranging a plurality of LED's emitting different colors. In this case, two LED's constituting each unit light source should preferably be located in offset positions, as shown in FIG. 4. That is, as shown in FIG. 4, metal layers 51 equivalent to the metal layers 34 or 41 of FIG. 3 are formed on a substrate equivalent to the substrate 33 or 40 of FIG. 3. An insulation layer 52 equivalent to the insulation layer 35 of FIG. 3 covers the metal layers 51 and the substrate, and metal layers 53 equivalent to the metal layers 36a, 36b, 36c and 36d, or 43a, 43b, 43c and 43d of FIG. 3 are formed on the insulation layer 52. Further, an LED emitting red light (wavelength: approx. 6,500 Å to 7,000 Å), e.g., a gallium phosphide LED 55a with Zn and O at its luminous center, and an LED emitting green light (wavelength: approx. 5,550 Å to 5,700 Å) e.g., a gallium phosphide LED 55b with N as its luminous center, are disposed opposite and in parallel to each other in offset positions on each common rectangular metal layer 54 formed of, e.g., silver paste which is connected with each metal layer 51 at one end side. The LED's 55a and 55b are connected at their anodes with their respective nearest metal layers 53 by means of gold wires 56. Offset width between each facing pair of LED's 55a and 55b is preferably approximately 10 to 110% of the length of the facing side of each LED.

More specifically, distances B and A respectively between straight lines passing through the respective centers of the minor and major sides of one metal layer 54 and straight lines passing through the respective centers of the minor and major sides of each adjacent metal layer 54 may be equal, length of e.g., 1.27 mm, and the LED's 55a and 55b may be regular octahedrons with a side length of 0.3 mm. Further, distance C between the LED's 55a and 55b on each common metal layer 54 may be reduced to, e.g., 20 to 50 $\mu$m, and the LED 55b may be shifted with an offset width D of 30 to 330 μm toward a side 58 opposite to a side 57 of the LED 55a in parallel with the LED 55b as a datum line.

In the display device with the aforementioned LED arrangement, light emitted from the LED's 55a and 55b on each common metal layer 54 constituting a unit light source may be less attenuated by interception or adsorption by walls of the LED's, and interference between LED's adjoining along the vertical direction and emitting different colors may be reduced, so that the distinction or resolution of color tone may be improved without deteriorating the general brightness.

Figure 5:
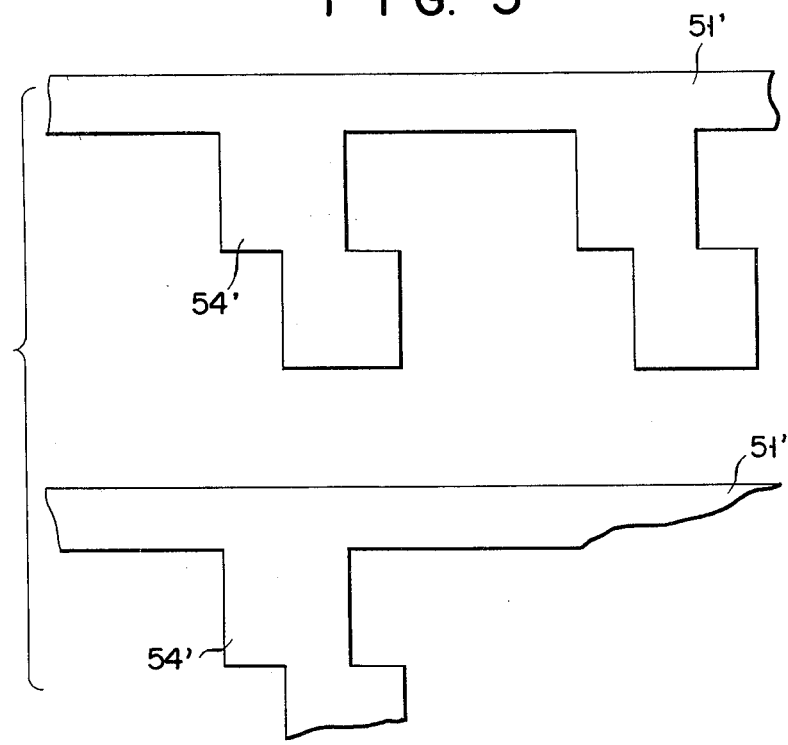
FIG. 5 is a plan view showing part of a modification of second conductive means of the display device shown in FIG. 4.

In the construction shown in FIG. 4, furthermore, the metal layers 51 and 54 may be integrated into such a configuration as shown in FIG. 5. In this manner, the LED's may easily be mounted on common metal layers 54' formed solidly with metal layers 51'.

What we claim is:
1. A display device comprising:
   an insulation substrate;
   first conductive means formed on said insulation substrate and including at least one elongated metal layer;
   insulation means formed on said first conductive means and including at least one pair of insulation layers facedly disposed near but spaced from each other along the longitudinal direction of said metal layer;
   second conductive means formed on said insulation means and including at least one pair of elongated metal layers formed respectively on said insulation layers in a position corresponding to the metal layer of said first conductive means;
   a light source formed on said second conductive means and including at least one light emitting diode; and connection means including at least one pair of connection members for connecting said first and second conductive means at sides opposite to the facing sides of said pair of insulation layers.

2. A display device according to claim 1 further comprising second insulation means covering said second conductive means and said first insulation means so as to surround said light source, said third conductive means formed on said second insulation means and including at least one elongated metal layer which extends at right angles to the longitudinal direction of the metal layers of said first conductive means.

3. A display device according to claim 2, wherein said light source is electrically connected with said third conductive means.

4. A display device according to any one of claims 1 to 3, wherein the metal layers of said second conductive means has at least one protrusion extending at right angles to the longitudinal direction thereof, said light source being mounted on said protrusion.

5. A display device according to claim 4, wherein said light source includes at least one pair of light emitting diodes which emit different colors.

6. A display device according to claim 5, wherein said pair of light emitting diodes are disposed adjacently and opposite to each other, facing in offset manner.

7. A display device according to claim 6, wherein said pair of light emitting diodes are shifted with an offset distance equivalent to 10 to 110% of the length of a side of each said diode.

8. A display device according to claim 6, wherein said light emitting diodes of said pair respectively emit light with a wavelength of 5,500 Å to 5,700 Å and light with a wavelength of 6,500 Å to 7,000 Å.

* * * * *